United States Patent

Sund

Patent Number: 5,860,582
Date of Patent: Jan. 19, 1999

[54] INERT ATMOSPHERE SOLDERING APPARATUS

[76] Inventor: William Sund, 8 Amos Crescent, Downsview, Ontario, Canada, M3H 3X9

[21] Appl. No.: 762,723

[22] Filed: Dec. 10, 1996

Related U.S. Application Data

[63] Continuation-in-part of Ser. No. 577,308, Dec. 22, 1995, Pat. No. 5,711,473.

[51] Int. Cl.$^6$ .................... H05K 3/34; B23K 3/06
[52] U.S. Cl. .................. 228/6.2; 228/40; 228/56.1; 118/429
[58] Field of Search .................. 228/6.2, 36, 40, 228/180.1, 56.1; 118/423, 429; 156/345, 578; 134/186

[56] References Cited

U.S. PATENT DOCUMENTS 5,112,559  5/1992  Lebrun .................... 118/429

Primary Examiner—Samuel M. Heinrich
Attorney, Agent, or Firm—McConnell and Fox

[57] ABSTRACT

An inert atmosphere spot soldering process and apparatus uses pockets arranged to match the arrangement of the terminals to be soldered. The pockets are filled to over flowing with liquid solder by lowering the pockets below the surface of the molten solder in a solder pot. A flow of hot inert gas is provided through orifices adjacent the pockets. The terminals and their surrounding area are exposed to the hot inert gas for a period sufficient to drive off substantially all volatile liquids and the terminals are then immersed in the solder to a depth determined by the menicus of the solder in the pockets. After immersion, the terminals are seperated from the solder surface and the flow of inert gas is terminated after permitting the solder to solidify. The inert gas may be heated by thermal conduction from the liquid solder.

12 Claims, 2 Drawing Sheets

INERT ATMOSPHERE SOLDERING APPARATUS

RELATED APPLICATION

This application is a continuation-in-part of application 08/577,308, Inert Atmosphere Soldering Apparatus filed Dec. 22 1995 now U.S. Pat. No. 5,711,473.

FIELD OF THE INVENTION

This invention relates to a soldering process and apparatus and in particular to an inert atmosphere spot soldering process and apparatus.

BACKGROUND OF THE INVENTION

In my prior U.S. Pat. No. 5,439,158 disclosed a soldering system having a controlled atmosphere bathing the solder pot and all liquid solder surfaces. In my prior U.S. Pat. No. 5,335,843 I disclosed a spot soldering apparatus which controlled the solder level and immersion of the leads by the meniscus formed by solder in pockets which were filled to overflowing with solder pumped up an adjacent duct. The terminals were then immersed by lowering the PC board until the terminals were a set distance below the meniscus. The pockets must be maintained hot to keep the solder liquid and could damage the printed circuit if they touch. The meniscus formed by the solder at the top of the pocket permits the terminals to be sufficiently immersed in liquid solder without the pocket touching the printed circuit.

In U.S. Pat. No. 5,711,473 the pockets were arranged in a manner similar to that in U.S. Pat. No. 5,335,843 but rather than filling them from adjacent orifices they were filled by raising the level of the solder around the pockets until the pockets were flooded.

In some situations the terminals to be soldered may be scattered around a printed circuit board and require a multiplicity of pockets properly located to solder a number of terminals substantially simultaneously. Other devices may be mounted on the lower surface of the PC board which would be damaged by contact with the solder. The use of pockets ensures that only those terminals and areas intended to be soldered are exposed to the solder. At the same time it is desirable that the pockets, terminals and solder surfaces be protected by an inert atmosphere as efficiently as possible.

In soldering terminals which are close together bridging may occur; that is adjacent terminals may be unintentionally connected by a solder bridge. A process which reduces this tendency is most desirable.

Flux is normally applied to areas to be soldered and the flux may contain volatiles or moisture which is desirably driven off before the terminals are soldered. The current move to volatile free fluxes makes this particularly important since water is now a common ingredient.

Solder balls are also produced in some processes and any reduction in their formation is desirable.

SUMMARY OF THE INVENTION

In accordance with the present invention a PC board (a printed circuit board) is delivered by a conveyer line to a solder station which is provided with pockets arranged in a movable plate to conform to the terminal arrangement, some times referred to as the "foot print" of the printed circuit. The pockets are arranged to be filled to overflowing with molten solder. An atmosphere of hot inert gas is provided below the plate between the surface of the solder and the plate. Orifices in the plate adjacent each pocket provide a flow of hot inert gas surrounding each pocket and the terminals prior to soldering. The hot inert gas preheats the area including the PC board and the terminals driving off moisture and volatiles and minimizing production of solder balls. The atmosphere of hot inert gas is continued after soldering, minimizing oxidation and bridging between terminals.

A clearer understanding of my invention may be had from a consideration of the following description and drawings in which:

DESCRIPTION OF THE PREFERRED EMBODIMENT

Figure 1:
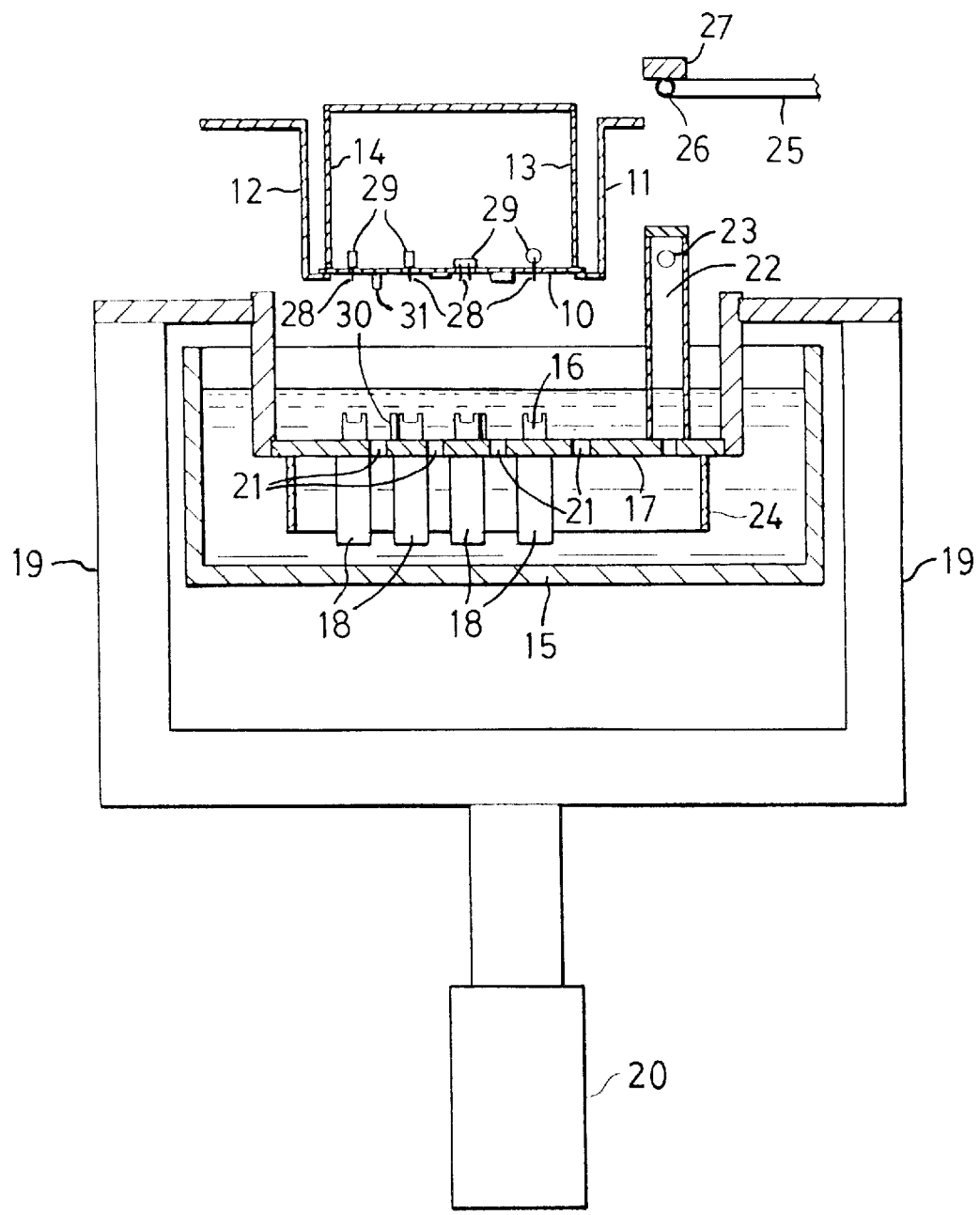
FIG. 1 is sectional view of a solder station in a soldering system in what is termed the loading stage in accordance with my invention.
Figure 3:
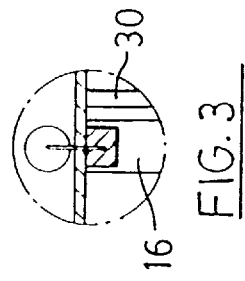
FIG. 3 is a detailed view of a portion of FIG. 2.
Figure 2:
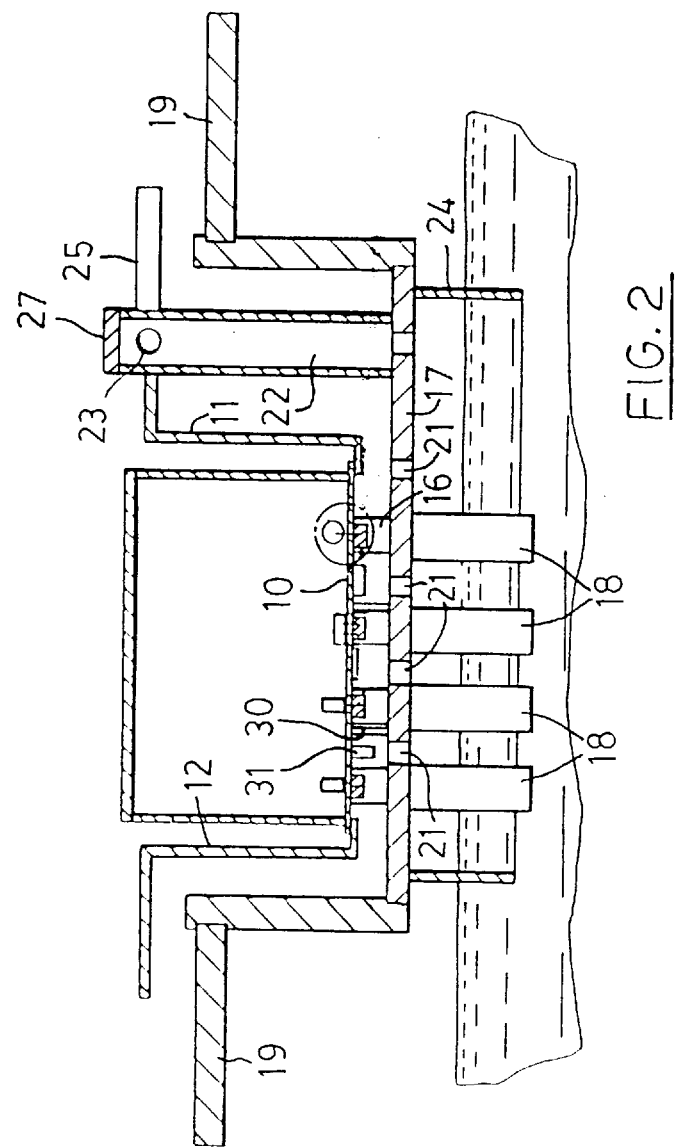
FIG. 2 is a sectional view of a portion of the solder station of FIG. 1 in what is termed the soldering stage.

FIGS. 1 and 2, show the various elements of a solder station in accordance with my invention. The station is intended to be included in a soldering line of the same general type as the one illustrated in U.S. Pat. No. 5,439,158 and to be controlled and supplied with hot inert gas as described in my U.S. Pat. No. 5,711,473 which is incorporated herein by reference. The PC (printed circuit) board 10 to be soldered is delivered to the solder station by any suitable conveyer system and held in place on rails 11 and 12 when properly located over solder pot 15 by hold down pins 13 and 14.

Within the solder pot are a number of solder pockets such as pocket 16 arranged to coincide with the location of the terminals on the PC board which are to be soldered. These pockets are mounted in a solder plate 17 which is movably mounted in the solder pot 15. Each pocket includes a heat sink 18 thermally connected to the pocket and constantly immersed in the solder.

A movable yoke 19 supports the solder plate 17 within the solder pot 15 and is mounted on an actuator 20 which is arranged to raise and lower the yoke 19 and thus solder plate 17.

Adjacent each solder pocket 16 there is an orifice 21 through solder plate 17 and a stand off 30 mounted on the solder plate. A gas supply riser 22 is mounted at one end of the solder plate 17 and is provided with an inlet orifice 23 at its upper end. A continuous skirt 24 projects downwards from the the periphery of solder plate 17. A gas supply line 25 is arranged above rail 11 with an orifice 26 arranged to sealably engage orifice 23 when both are aligned.

OPERATION

With the actuator 20 de-energized yoke 19 is in its lowest position as shown in FIGS. 1. The solder pot 15 is filled with molten solder maintained at the desired temperature by the usual heat control system. The conveyer system moves the PC board into position along rails 11 & 12 and the mechanism supporting pins 13 & 14 lowers the pins to hold the PC board 10 firmly in position. A skimmer may now remove the dross from the surface of the solder as described in U.S. Pat. No. 5,711,473 supra. Actuator 20 is energized raising yoke 19 and thus solder plate 17. As the solder pockets 16 rise above the level of the solder in pot 15 each pocket is filled to overflowing forming a meniscus of molten solder at its top. As the plate rises it raises riser 22. The top of riser 22 encounters stop plate 27 which aligns orifices 23 and 26. The plate continues to rise carrying the gas supply line 25 with it. A supply of hot inert gas such as nitrogen is provided though gas supply line 25 which travels down riser 22 under solder plate 17 up through orifices 21 and around the solder pockets 16 and terminals 28 of components 29. The timing of the gas and preheating may be controlled as described in U.S. Pat. No. 5,711,473. The solder plate continues to rise until the terminals 28 of components 29 are just immersed in solder to a level determined by the meniscus of solder in each pocket and by the stand off 30 adjacent each pocket which prevents the hot pocket from actually touching the PC board. The stand offs are mounted on the solder plate and are preferably of a suitable poor thermal conducting material and project a few thousandths of an inch beyond the top of each pocket.

After a predetermined time sufficient to ensure proper soldering of the components to the circuit the actuator 20 gradually lowers yoke 19 and the solder plate 17 while flow of gas is continued down through riser 22 protecting the soldered area during the cooling process. As described in U.S. Pat. No. 5,711,473 the PC board may be tilted during this process to minimize bridging.

As may be seen in FIG. 2 device 31, which is mounted on the lower surface of the board, projects below the top of the pockets during soldering but is not exposed to the molten solder.

While the apparatus has been shown in some detail it will be understood that numerous variations of the structures could be arranged to function in a substantially similar manner. The exact apparatus would depend upon the nature of the device being soldered. For example, while it has been described as designed to spot solder terminals on a PC board, it could be designed to spot solder any arrangement of terminals or devices which require precise, automated soldering. The provision of a hot inert atmosphere primarily around the elements being soldered and the sequencing of the various steps of the process can clearly have other applications.

It will also be understood that while the apparatus and process have been described as a soldering process the equipment may also be used in a desoldering process where it is desired to remove one or more elements from a previously soldered board. It is only necessary to conform the pockets to the desired foot print and only the terminals of the element to be removed will be immersed in solder. The element may then be removed without damage to adjacent elements.

I claim:

1. A soldering apparatus comprising, a solder pot, heating means to maintain solder liquid within said pot, at least one pocket mounted within said solder pot, means to move a device which includes terminals to be soldered to a first position over said solder pot with said terminals directly above said pocket, means to supply heated inert gas to the vicinity of said pocket, means to fill said pocket with liquid solder from said pot, means to change the relative position of said pocket and said terminals to a position where said terminals are almost immersed in said liquid solder in said pocket and are exposed to said heated inert gas, means to further change the relative position of said pocket and said terminals to a position where said terminals are immersed in said liquid solder in said pocket, means to further change the relative position of said pocket and said terminals until said terminals are no longer immersed in said liquid solder and means to raise said device to its initial first position.

2. A soldering apparatus as claimed in claim 1 wherein said device is a printed circuit and said apparatus includes means to flatten said printed circuit and hold it firmly in a horizontal position parallel to the surface of said solder in said pot.

3. A soldering apparatus as claimed in claim 1 wherein said means to fill said pocket comprises means to lower said pocket below the surface of the solder in said solder pot.

4. A soldering apparatus as claimed in claim 3 wherein said inert gas is preheated by conduction from said solder pot.

5. A soldering apparatus including a device having terminals to be soldered projecting downwards, a solder pot containing molten solder, a solder plate within said solder pot including at least one pocket rising upwards from said solder plate and vertically aligned with said terminals, orifices in said solder plate adjacent said at least one pocket, means to lower said solder plate until the top of said pocket is below the surface of said molten solder, means to raise said solder plate until said pocket is near but not touching said terminals, means to provide a flow of hot inert gas upwards through said orifices around said pocket and said terminals, means to further raise said solder plate until said terminals are immersed in the solder contained in said pocket, means to lower said solder plate until said terminals are no longer immersed in the solder in said pocket while continuing said flow of inert gas and permitting the solder on the terminals to solidify.

6. Soldering apparatus as claimed in claim 5 wherein stand-off means are mounted on said solder plate adjacent said pocket and extend to a point slightly beyond the top of said pocket whereby said terminals may be immersed in said liquid solder in said pocket but may not contact said pocket.

7. A soldering apparatus comprising, a solder pot, heating means to maintain solder liquid within said pot, at least one pocket mounted within said solder pot, means to move a device which includes terminals to be soldered to a first position over said solder pot with said terminals directly above said pocket, means to supply heated inert gas to the vicinity of said pocket, means to fill said pocket with liquid solder from said pot, means to change the relative position of said pocket and said device so that said terminals are almost immersed in said liquid solder in said pocket and are exposed to said heated inert gas, means to further change the relative position of said pocket and said device said to a position where said terminals are immersed in said liquid solder in said pocket, means to change the relative position of said pocket and said device until said terminals are no longer immersed in said liquid solder and means to raise said device to its initial first position.

8. A soldering apparatus as claimed in claim 7 wherein means are provided to continue said supply of inert gas after said terminals are no longer immersed in said liquid solder.

9. A soldering apparatus as claimed in claim 1 wherein said inert gas is heated by thermal conduction from said liquid solder.

10. A soldering apparatus as claimed in claim 9 wherein said inert gas is passed through a tube fastened to the wall of said solder pot.

11. A soldering apparatus as claimed in claim 9 wherein said inert gas is passed through a tube immersed in said liquid solder.

12. A soldering apparatus as claimed in claim 1 wherein said means to fill said cup with liquid solder comprises means to raise and lower the level of the solder in said pot above and below the upper edge of said cup.

* * * * *